(12) United States Patent  
Cabatbat et al.

(10) Patent No.: US 9,048,397 B2
(45) Date of Patent: Jun. 2, 2015

(54) COLOR YIELD OF WHITE LEDS

(71) Applicant: CARSEM (M) SDN. BHD., Perak Darul Ridzuan (MY)

(72) Inventors: Edmund Sales Cabatbat, Isabela (PH); Lily Khor, Perak (MY); Ho Tuck Ming, Perak (MY)

(73) Assignee: Carsem (M) SDN. BHD. (MY)

( * ) Notice: Subject to any disclaimer, the term of this patent is extended or adjusted under 35 U.S.C. 154(b) by 0 days.

(21) Appl. No.: 14/148,281

(22) Filed: Jan. 6, 2014

(65) Prior Publication Data

US 2015/0087087 A1 Mar. 26, 2015

(51) Int. Cl.
  *H01L 21/66* (2006.01)
  *H01L 33/50* (2010.01)
  *H01L 33/52* (2010.01)
  *H01L 27/15* (2006.01)

(52) U.S. Cl.
  CPC .............. *H01L 33/502* (2013.01); *H01L 33/52* (2013.01); *H01L 27/156* (2013.01)

(58) Field of Classification Search
  CPC ....... H01L 27/15; H01L 27/156; H01L 33/50; H01L 33/501; H01L 33/502; H01L 33/52
  USPC ................................. 438/7, 15, 16, 26, 27, 28
  See application file for complete search history.

(56) References Cited

U.S. PATENT DOCUMENTS

| | | |
|---|---|---|
| 7,224,000 B2 | 5/2007 | Aanegola et al. |
| 7,256,057 B2 | 8/2007 | Schardt et al. |
| 7,710,369 B2 | 5/2010 | Dowling |
| 8,038,497 B2 | 10/2011 | Le Toquin |
| 8,212,466 B2 | 7/2012 | Negley et al. |
| 8,227,269 B2 | 7/2012 | Chen et al. |
| 8,716,038 B2 * | 5/2014 | Tetz et al. ..................... 438/16 |
| 2007/0228949 A1 * | 10/2007 | Maruyama et al. ........... 313/512 |
| 2008/0106185 A1 * | 5/2008 | Yamakawa .................... 313/503 |
| 2009/0095966 A1 | 4/2009 | Keller et al. |
| 2009/0117672 A1 * | 5/2009 | Caruso et al. ..................... 438/7 |
| 2010/0123386 A1 | 5/2010 | Chen |
| 2010/0252851 A1 | 10/2010 | Emerson et al. |
| 2012/0038280 A1 | 2/2012 | Zoorob et al. |
| 2012/0051045 A1 | 3/2012 | Harbers et al. |
| 2012/0178188 A1 | 7/2012 | Yoo et al. |
| 2012/0286669 A1 | 11/2012 | Yan et al. |
| 2013/0037838 A1 | 2/2013 | Speier et al. |
| 2013/0075769 A1 | 3/2013 | Yan et al. |
| 2013/0077299 A1 | 3/2013 | Hussell et al. |
| 2013/0119275 A1 | 5/2013 | Solarz |
| 2013/0177998 A1 * | 7/2013 | Hong et al. ..................... 438/15 |

* cited by examiner

*Primary Examiner* — Kevin M Picardat
(74) *Attorney, Agent, or Firm* — Kilpatrick Townsend & Stockton LLP

(57) ABSTRACT

A method of disposing a phosphor material on an LED such that the LED emits white light and adjusting the quantity of phosphor material such that the white light meets a color target. A formulated procedure is used to determine the adjustment required, and includes a correlation between a change in position of a color of an LED on a CIE diagram and a known quantity of phosphor material added to the LED.

20 Claims, 6 Drawing Sheets

Section A-A

Section A-A

COLOR YIELD OF WHITE LEDS

CROSS-REFERENCES TO RELATED APPLICATIONS

This application claims priority to Malaysian Patent Application No. PI2013701728, filed Sep. 20, 2013, which is referred to and incorporated herein by reference in its entirety.

BACKGROUND OF THE INVENTION

The present invention generally relates to light emitting diodes (LEDs) and in particular to LEDs that are coated with one or more phosphor materials.

An LED is a semiconductor-based light source. LEDs are used as indicator lamps in many devices and are increasingly used for general lighting. When an LED is activated, electrons are able to recombine with holes within the device, releasing energy in the form of photons. This effect is called electroluminescence, and the color of the light (corresponding to the energy of the photon) is determined by the energy band gap of the semiconductor. LEDs have many advantages over incandescent light sources including lower energy consumption, longer lifetime, improved physical robustness, smaller size, and faster switching.

In some applications, a phosphor material is disposed on top of the LED and used to convert monochromatic light from a blue or ultra-violet LED to broad-spectrum white light, much in the same way a fluorescent light bulb works. This method involves coating LEDs with a mixture of phosphors of different colors to form the desired color of white light. Depending on the color of the original LED, the mixture of phosphors of different colors and the amount of phosphors can be varied to achieve the desired white light color.

BRIEF SUMMARY OF THE INVENTION

Embodiments of the invention pertain to LEDs that are covered with a phosphor material formulated to emit white light. Some embodiments of the invention pertain to methods of adjusting the amount of phosphor material disposed on the LED.

In some embodiments white LED components are manufactured by first determining a color target for the desired white light. A phosphor material based upon the color of the LED and the color target for the white light is prepared. In some embodiments the phosphor material may include a mixture of different phosphors to convert the light emitted by the LED to the desired color target. In further embodiments the phosphor material may include silicone.

A specific amount of phosphor material that will convert the color of the LED to the color target is then determined. In some embodiments a formulated procedure is used to determine the initial amount of phosphor material required. In one embodiment, phosphor material is incrementally added to the LED and the color of the LED is tested against the color target. An iterative process may be employed wherein the amount of phosphor material is incrementally increased until the color target of the white LED is met. The desired initial amount of phosphor material may then be determined and used on subsequent LEDs.

In further embodiments a formulated procedure is used to establish a correlation between a change in position of a color of an LED on a CIE diagram and a known quantity of phosphor material that was added to the LED. This correlation enables the appropriate amount of phosphor material to be added to or removed from LEDs that do not meet the color target. Once the LEDs meet the color target the phosphor material may be cured.

DETAILED DESCRIPTION OF THE INVENTION

In the following description, various embodiments are described. For purposes of explanation, specific configurations and details are set forth in order to provide a thorough understanding of the embodiments. It will also be apparent to one skilled in the art that the present invention can be practiced without the specific details described herein. Furthermore, well-known features may be omitted or simplified in order not to obscure the embodiment being described.

As discussed earlier, the invention may apply to a variety of LEDs that are coated with phosphor material. Accordingly, this invention may be used with light emitting components (LECs) that employ one or more LEDs. More specifically, embodiments of this invention may be employed in the manufacture of LEDs that are desired to meet a particular color target.

Due to variations in the wavelengths of light emitted by the LED die and the reflectivity of the substrate on which the LED die is mounted, depositing the same amount of phosphor material on each LED may not enable every LED to meet the desired color target. Therefore, it may be desirable to adjust the amount of phosphor material to "tune" outlying LEDs into meeting the color target. This tuning may require the addition or removal of phosphor material from the LED. In some embodiments it may be desirable to adjust the amount of phosphor material before curing the phosphor material. If the LED meets the color target and no adjustment is required, the phosphor material may be cured.

To minimize the number of adjustments, it may be desirable to determine the amount of phosphor material that needs to be added or removed according to a formulated procedure. Once the amount of material is added or removed, the LED may be retested and subsequently cured if it falls within the color target. However, if it does not fall within the color target it may be readjusted and subsequently cured, or scrapped.

Figure 1A:
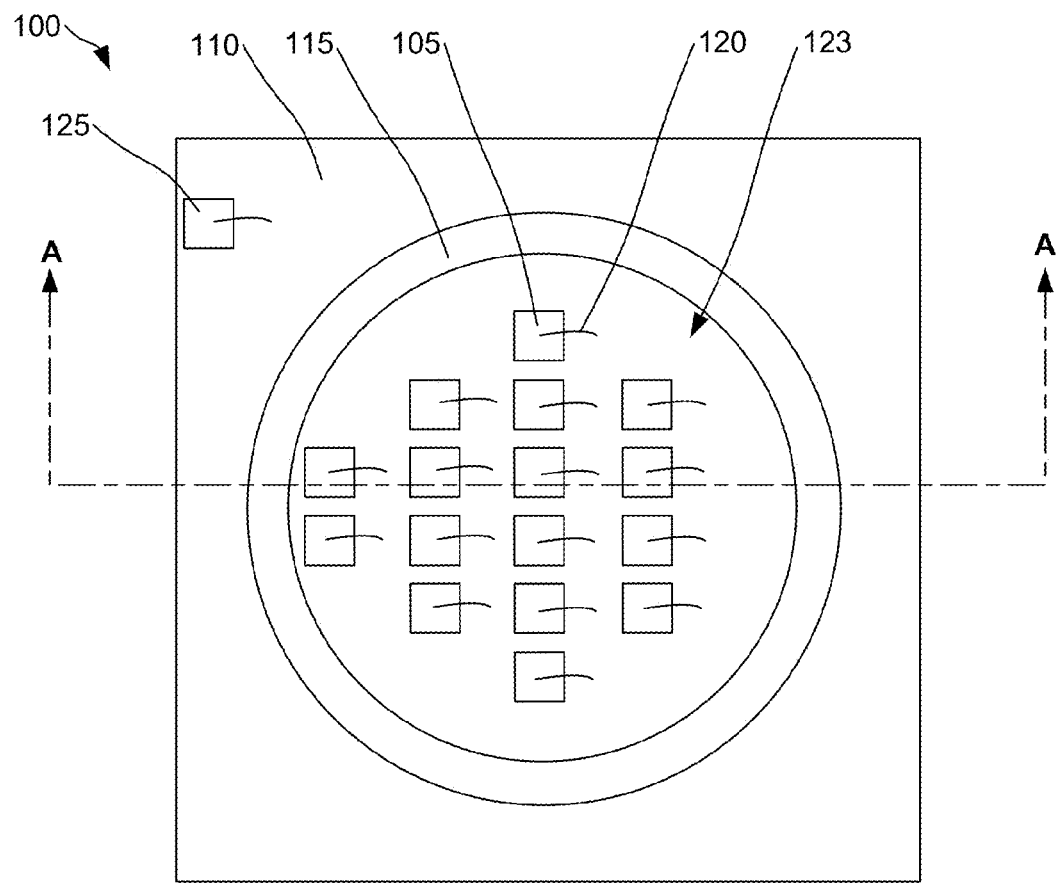
FIG. 1A is an illustration a light emitting component.

FIG. 1A depicts an illustrative rendering of one particular LEC 100. In this embodiment a plurality of LED dice 105 are attached to substrate 110. The plurality of dice are surrounded by a retaining wall 115 forming a cavity 123. Each die of the plurality of dice have one or more wires 120 attached between each die 105 and substrate 110. In some embodiments one or more external components 125 may also be attached to substrate 110. In other embodiments, as described in more detail below, LEC 100 may have more or fewer dice than illustrated in FIG. 1A.

In some embodiments die 105 may emit blue light which is generally described as having a wavelength between approximately 450 nm and 500 nm, although other wavelengths may also be considered to be blue. In further embodiments, blue LEDs may be based on wide band gap semiconductors including GaN (gallium nitride) and InGaN (indium gallium nitride). In other embodiments ZnSe (zinc selenide), SiC (silicon carbide) or S (silicon) may be used. In further embodiments such devices may have an active region consisting of one or more InGaN quantum wells sandwiched between thicker layers of GaN, called cladding layers. By varying the relative In/Ga fraction in the InGaN quantum wells, the emitted wavelength may be varied. Other LED materials and configurations may be employed without departing from the invention.

In other embodiments die 105 may emit ultra-violet (UV) light which is generally described as having a wavelength of less than 400 nm, although other wavelengths may also be considered to be UV. In some embodiments, UV LEDs may be based on semiconductors including AlN (aluminium nitride), AlGaN (aluminium gallium nitride) and AlGaInN (aluminium gallium indium nitride). In other embodiments semiconductors including diamond and BN (boron nitride) may be used. The cladding and quantum well layers for ultraviolet LEDs may be manufactured from AlGaN (aluminium gallium nitride) and varying compositions of Al and Ga. Other LED materials and configurations may be employed without departing from the invention.

In some embodiments, retaining wall 115 may be fabricated by dispensing a high viscosity material having a high thixotropic index. Such materials may be able to maintain a relatively high height to width aspect ratio during the dispensing and curing operations. In some embodiments the viscosity of the retaining wall material may range from 50,000 centipoise to 1,300,000 centipoise. In other embodiments the material may have a higher or lower viscosity. In some embodiments retaining wall 115 may be made from an epoxy that is cured with heat and/or light after being dispensed. In still further embodiments, retaining wall 115 may be formed using another method such as placing a preformed retaining wall composed of a plastic, a metal, a ceramic or other material on the substrate and bonding it with an adhesive. Other embodiments may use still further methods to form retaining wall 115. In some further embodiments, a retaining wall 115 may not be needed when a cavity type substrate is used.

In some embodiments, substrate 110 may be predominantly silicon or may include silicon. In further embodiments, substrate 110 may be a circuit board or other structure. In still further embodiments, substrate 110 may include a ceramic material, or a sapphire material. Die 105 may be bonded to substrate 110 with an adhesive, a solder or other material. In some embodiments the bonding material may be electrically conductive while in other embodiments the bonding material may be electrically insulative. In some embodiments, wires 120 may be made from gold, silver, aluminum or copper. In other embodiments wires 120 may be made from a metal alloy or a different material.

Figure 1B:
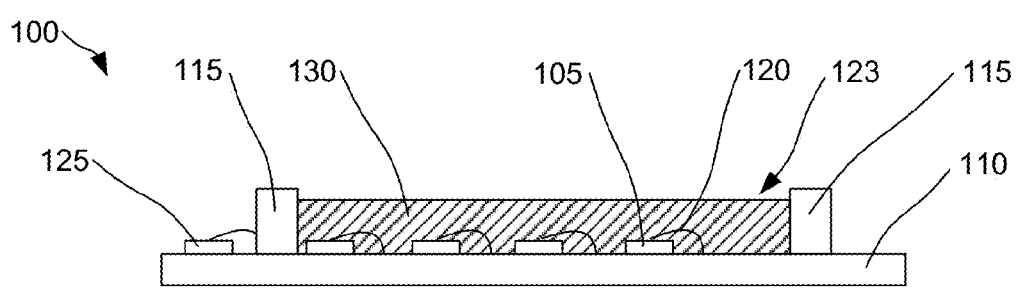
FIG. 1B is an illustration of a cross-section of a light emitting component.

FIG. 1B depicts a cross-sectional view A-A of LEC 100 depicted in FIG. 1A. In this view a phosphor material 130 has been added within cavity 123 substantially covering die 105. Phosphor material 130 may be added by manual dispensing, automatic dispensing, jet printing, bubble printing, pipette, manual operations and other applicable methods. Manual operations may include manual dispensing with a syringe, pipette or other handheld tool.

As defined herein, a phosphor material, most generally, is a substance that exhibits the phenomenon of luminescence. This includes both phosphorescent and fluorescent materials. Phosphors are often composed at least partially from transition metal compounds or rare earth compounds of various types. To create white light from the emitted blue light of a blue LED, a fraction of the blue light undergoes a Stokes shift within the phosphor, wherein the blue light is transformed to longer wavelengths, namely yellow and green. Thus, the combination of the blue light from the LED and the yellow and green from the phosphor result in an emitted white light from LEC 100. Depending on the color of the original LED, phosphors of different colors can be employed to achieve the desired color target. If several phosphor layers of distinct colors are applied, the emitted spectrum is broadened, effectively raising the color rendering index value of a given LED.

In some embodiments the phosphor material may include Cerium (III)-doped YAG (YAG:Ce3+), or (Y3Al5O12: Ce3+). These materials absorb the light from the blue LED and emit in a broad range from greenish to reddish, with most of their output in yellow. In further embodiments, the yellow emission of the Ce3+:YAG can be tuned by substituting the cerium with other rare earth elements such as terbium and gadolinium. In one embodiment the phosphor can be tuned by substituting some or all of the aluminum in the YAG with gallium. However, this process is not one of phosphorescence and may be a process known as scintillation. In further embodiments, some rare-earth doped Sialons are photoluminescent and can serve as phosphors. As an example, Europium(II)-doped β-SiAlON absorbs in ultraviolet and visible light spectrum and emits broadband visible wavelengths. In some embodiments, a blue LED is used with a yellow phosphor, or with a green and yellow SiAlON phosphor and a red CaAlSiN3-based (CASN) phosphor. In still further embodiments, white LEDs can also be made by coating near ultraviolet (NUV) emitting LEDs with a mixture of high efficiency europium based red and blue emitting phosphors plus green emitting copper and aluminum doped zinc sulfide (ZnS:Cu,Al). This is a method analogous to the way fluorescent lamps work. Other materials and configurations may be employed without departing from the invention.

The phosphor agents discussed above may be mixed with a silicone, epoxy, or other liquid medium to make them dispenseable. In some embodiments, the phosphor agents are mixed with a clear silicone that cures in the presence of moisture and/or heat.

Figure 2:
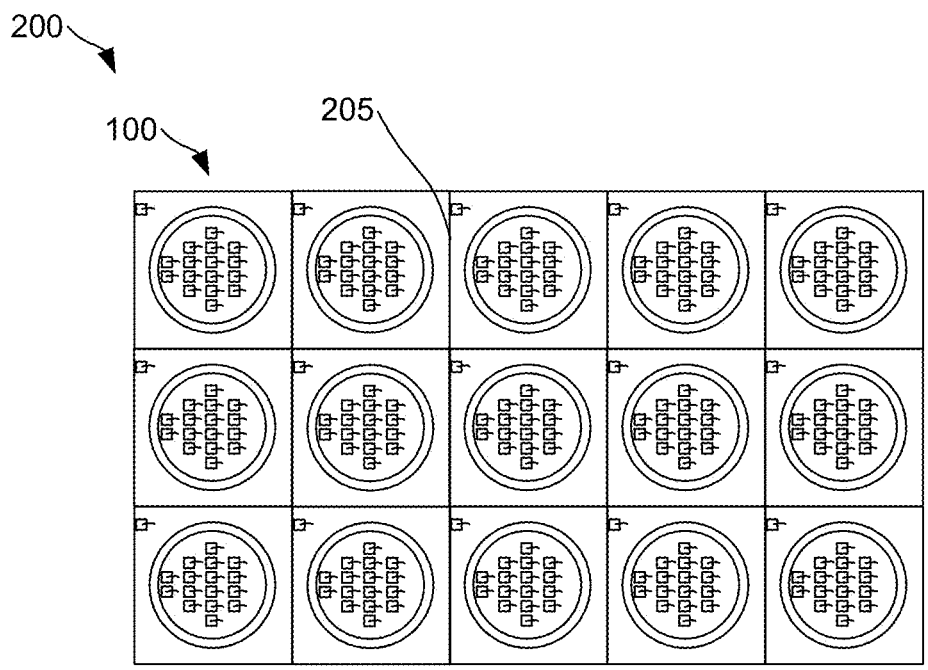
FIG. 2 is an illustration of a panel of light emitting components.

FIG. 2 depicts a view of a plurality of LECs 100 in a panel 200. In some embodiments LECs 100 may be assembled on panel 200 such that a plurality of LECs can be batch processed in a manufacturing line. In further embodiments, panel 200 may be singulated into individual LECs 100 by sawing or cutting along singulation lines 205. Singulation may occur after any stage of manufacturing and often occurs at the conclusion of the process. Singulation may be performed by sawing, cutting, cleaving, breaking, punching or any other operation that is capable of singulating LECs 100.

Figure 3:
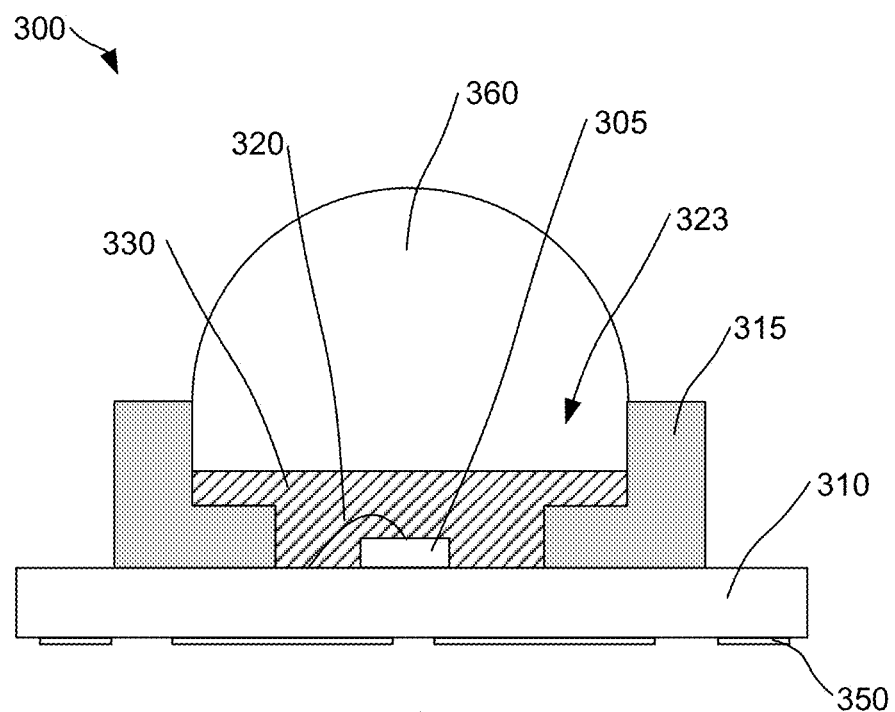
FIG. 3 is an illustration of a cross-section of a light emitting component.

FIG. 3 depicts a cross-section of a single die LEC 300. In this embodiment a single LED die 305 is attached to substrate 310. Die 305 is surrounded by a retaining wall 315 forming a cavity 323. Die 305 has one or more wires 320 attached between the die and substrate 310. In further embodiments, substrate 310 may have one or more attachment pads 350 for electrical connection to LEC 300. In some embodiments one or more external components (not shown) may also be attached to substrate 310. In other embodiments, LEC 300 may have more die than illustrated in FIG. 3. A phosphor material 330 has been disposed within cavity 323, substantially covering die 305. LEC 300 may further include lens 360 disposed over phosphor material 330.

Figure 4:
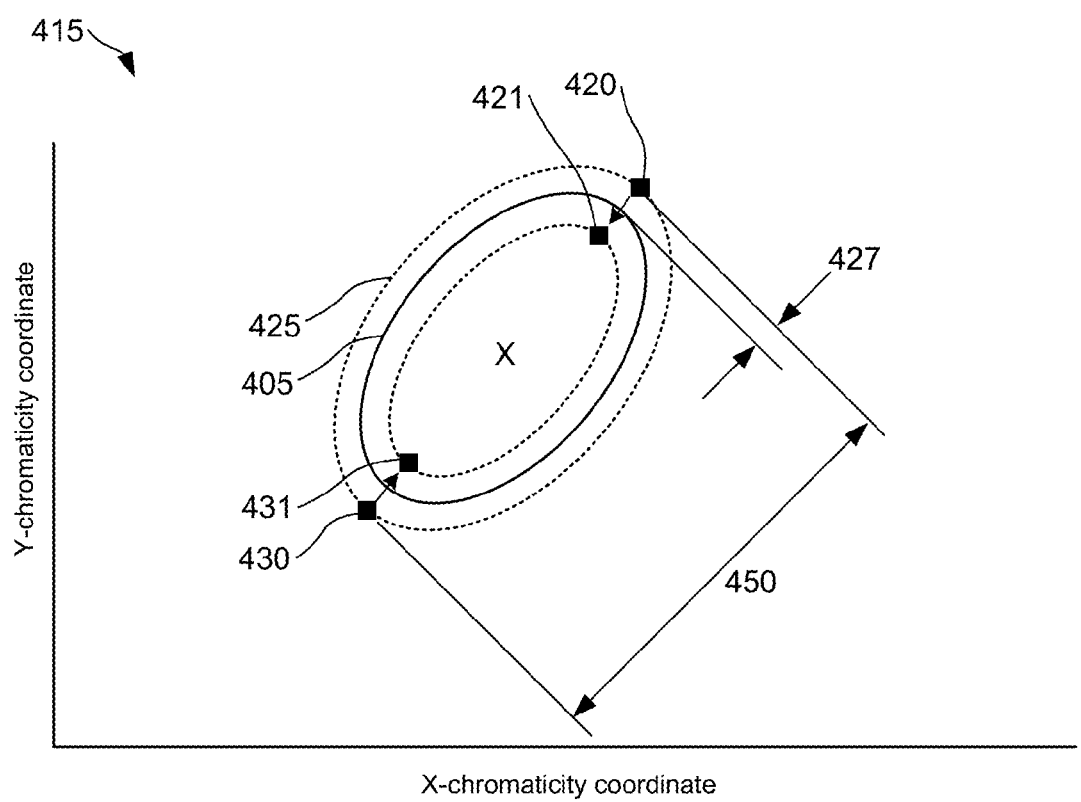
FIG. 4 is an illustration of a color target on a CIE chromaticity diagram.

FIG. 4 illustrates an example color target 405 plotted on a CIE chromaticity diagram 415. CIE chromaticity diagram 415 illustrates how the human eye will experience light with a given spectrum. Thus, the color of LECs can be tested and plotted on CIE chromaticity diagram 415 and it can be determined if they meet (fall within) color target 405. In some embodiments color target 405 may be defined as a MacAdam ellipse. A MacAdam ellipse is a region on a CIE chromaticity diagram that contains all colors that are indistinguishable to the average human eye. Thus, if each LEC falls within a MacAdam ellipse, then the differences in color of the LECs are indistinguishable to the human eye. However, if the color of a LEC falls outside (an outlier) of a MacAdam ellipse, they will be seen as a different color by the human eye.

As further illustrated in FIG. 4 the color of two LECs are plotted as a first LEC point 420 and a second LEC point 430. First LEC point 420 is outside and above color target 405. Second LEC point 430 is outside and below color target 405. Both first and second points 420, 430 lie on outer line 425. Outer line 425 is approximately one eighth 427 of a diameter 450 of color target 405.

As discussed above, it may be desirable to adjust first and second LEC points 420, 430 to be within color target 405 so they are approximately the same color. More specifically, first LEC point 420 may be adjusted down to a first adjusted location 421 that lies within color target 405. Similarly, second LEC point 430 may be adjusted up to second adjusted location 431 that lies within color target 405. In this particular example first and second LEC points 420, 430 have been adjusted a distance approximately equal to one fourth diameter 450 of color target 405. In some embodiments, these adjustments may be made by adding or removing a calculated amount of phosphor material to or from the LEC. More specifically, in one embodiment, to move from first LEC point 420 to first adjusted location 421 a calculated amount of phosphor material may need to be removed from the LEC. Phosphor material may be removed by laser ablation, pipette, manual removal with a handheld tool or instrument, or other applicable methods. Similarly, to move from second LEC point 430 to first adjusted location 431 a calculated amount of phosphor material may need to be added to the LEC. Phosphor material may be added by manual dispensing, automatic dispensing, jet printing, bubble printing, pipette, manual operation or other applicable methods. Thus, in some embodiments, a formulated procedure may be used to adjust the position of first LEC point 420 and second LEC point 430 on CIE chromaticity diagram 415 such that they fall within color target 405.

Figure 5:
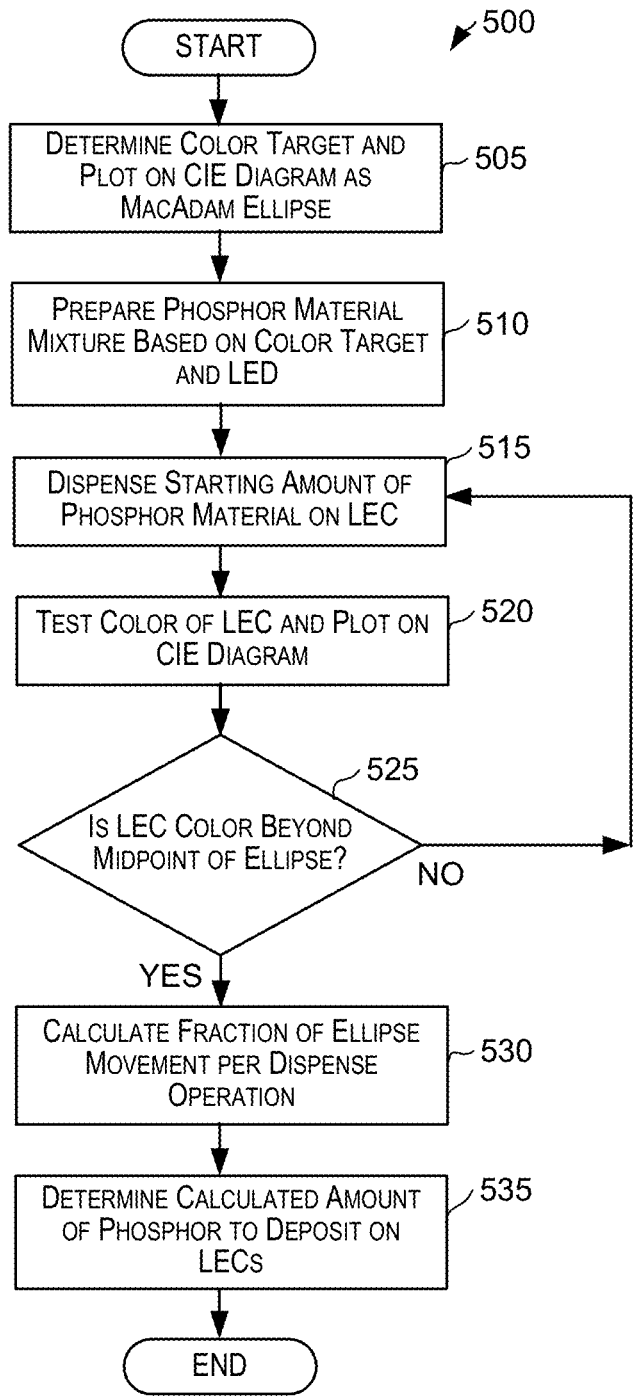
FIG. 5 is a formulated procedure for determining a calculated amount of phosphor material to add to or remove from a light emitting component (LEC) to meet a color target.

It should be appreciated that the specific steps illustrated in FIG. 5 provide particular methods of determining how much phosphor material to add or remove to adjust an LEC, according to embodiments of the present invention. Other sequences of steps may also be performed according to alternative embodiments. In certain embodiments, the methods may perform the individual steps in a different order, at the same time, or any other sequence for a particular application. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives in light of the disclosed methods.

FIG. 5 illustrates a simplified procedure 500 for determining a calculated amount of phosphor material to add or remove to adjust a LEC to meet a color target. In step 505 a color target 605 (see FIG. 6) for the LEC is determined and is plotted on a CIE diagram 615. In step 510 a phosphor material mixture is prepared based on color target 605 and the emitted light from the particular LED used. More specifically, the phosphor mixture is selected and formulated as discussed above such that when an appropriate quantity of phosphor material is deposited on the LED, the emission from at least some LECs will be within, or near to, color target 605. In some embodiments, the wavelength of the LED, or combination of LEDs, along with the reflectivity of the substrate are taken into consideration in the formulation of the phosphor mixture.

In step 515 a starting amount of phosphor material is deposited on the one or more LED die in the LEC. The starting amount of phosphor material is a quantity that is less than the quantity required to meet color target 605. In step 520 the color of the LEC is tested. In some embodiments, multiple LEC samples may be used to improve the accuracy of procedure 500. As an example, the colors of first dispense results 630 of three LECs are plotted on CIE diagram 615 illustrated in FIG. 6. As further illustrated, first dispense results 630 are outside color target 605.

In step 525 it is determined if the colors of first dispense results 630 are beyond a midpoint 607 (see FIG. 6) of color target 605. In some embodiments other markers may be used than midpoint 607. Here it is clear that first dispense results 630 have not passed midpoint 607 of color target 605. Thus process 500 returns back to step 515 wherein the same starting amount of phosphor material is deposited on the LED die. In other embodiments, a different amount of phosphor material may be deposited at this step. In step 520 the colors of the three LECs are tested. As an example, the colors of second dispense results 635 of three LECs are plotted on CIE diagram 615 illustrated in FIG. 6. As further illustrated it can be seen that first dispense results 630 moved a distance 646 to second dispense results 635 due to the addition of the phosphor material.

In step 525 it is determined if the color of second dispense results 635 are beyond midpoint 607 (see FIG. 6) of color target 605. In some embodiments other markers may be used than midpoint 607. Here it is clear that second dispense results 635 have not passed midpoint 607 of color target 605. Thus process 500 returns back to step 515 wherein the same starting amount of phosphor material is deposited on the LED die. In other embodiments, a different amount may be deposited at this step. In step 520 the colors of the LECs are tested. As an example, the colors of third dispense results 640 of three LECs are plotted on the CIE diagram illustrated in FIG. 6. As further illustrated it can be seen that second dispense results 635 moved a distance 645 to third dispense results 640 due to the addition of the phosphor material.

Figure 6:
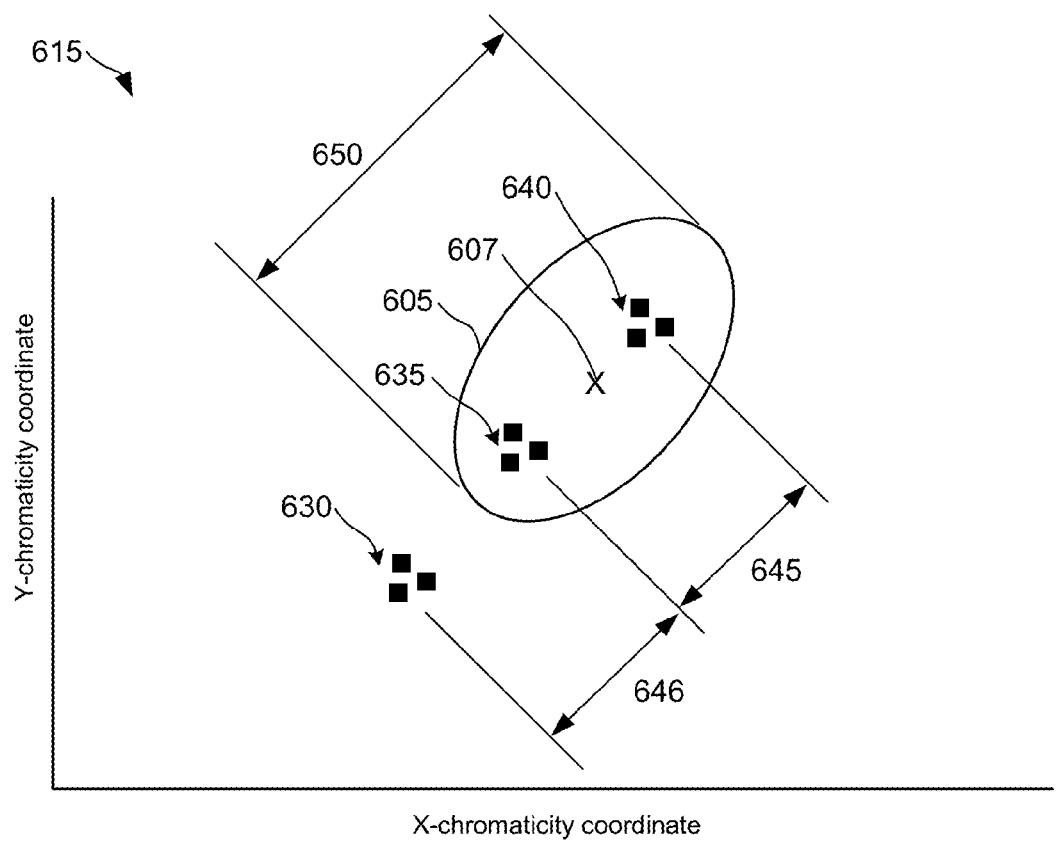
FIG. 6 is an illustration of a color target on a CIE chromaticity diagram.

In step 525 it is determined if the color of third dispense results 640 are beyond midpoint 607 (see FIG. 6) of color target 605. In some embodiments other markers may be used than midpoint 607. Here it is clear that third dispense results 640 have passed midpoint 607 of color target 605. Thus process 500 continues to step 530 where the fraction of color target 605 movement per dispense operation is calculated. More specifically, as illustrated in FIG. 6, distance 646 may be divided by diameter 650 yielding the amount of movement of the LECs per dispense operation, in terms of diameter 650. As an example, if distance 646 is 0.1 units and diameter 650 is 0.2 units then the transition from first dispense results 630 to second dispense results 635 is one half diameter 650. Thus, the correlation may be defined wherein one dispense operation moves the color of the LECs approximately half diameter 650 of color target 605.

In a similar fashion, distance 645 may be divided by diameter 650, or distance 646 may be added to distance 645 and the result divided by the diameter, then the result of that divided by two to yield an average amount of movement per dispense. Other methods of calculation may be employed to develop correlations without departing from the scope of this disclosure. In one embodiment, a correlation may be developed that relates the movement of the color of the LECs per dispense to diameter 650 of color target 605.

As a further example, if the amount of phosphor material that was dispensed is a known quantity, such as for example 0.1 microliters, then a correlation between a change in position of a color of an LED on a CIE diagram and a known volume of phosphor material added to the LED can be developed. In this example, the color of the LECs will shift approximately one half diameter 650 of color target 605 per 0.10 microliters of phosphor material added. The converse may also be true wherein the color of the LECs will shift the opposite direction approximately one half diameter 650 of color target 605 per 0.10 microliters of phosphor material removed. The direction of movement on the CIE diagram is determined by whether phosphor material is added or removed.

This correlation may then be used in subsequent phosphor adjustment operations to fine tune the position of a specific LEC on the CIE diagram such that it will meet color target 605. More specifically, the formulated procedure may be used to determine a calculated amount of phosphor material that needs to be added to or removed from a particular LEC to adjust its color to be within color target 605.

In addition, data gathered in procedure 500 may be used to determine an initial amount of phosphor that is required to be deposited on the LECs to make at least some of them meet color target 605 in a single dispense operation. More specifically, all LEDs with similar color and substrate reflectivity properties can receive the same initial amount of phosphor material such that at least some of them can meet color target 605 without requiring adjustment. Then only the LECs that do not meet color target 605 need be adjusted. In this particular example, illustrated in FIG. 6, approximately one and one half dispenses of a quantity of 0.10 microliters would place at least some of the LECs near midpoint 607 of color target 605. More specifically, in the example above, the initial volume of phosphor material to be dispensed on all LECs would be 0.15 microliters. With the variation in manufacturing parameters, some LECs will not meet color target 605 (outliers) and may be adjusted.

Figure 7:
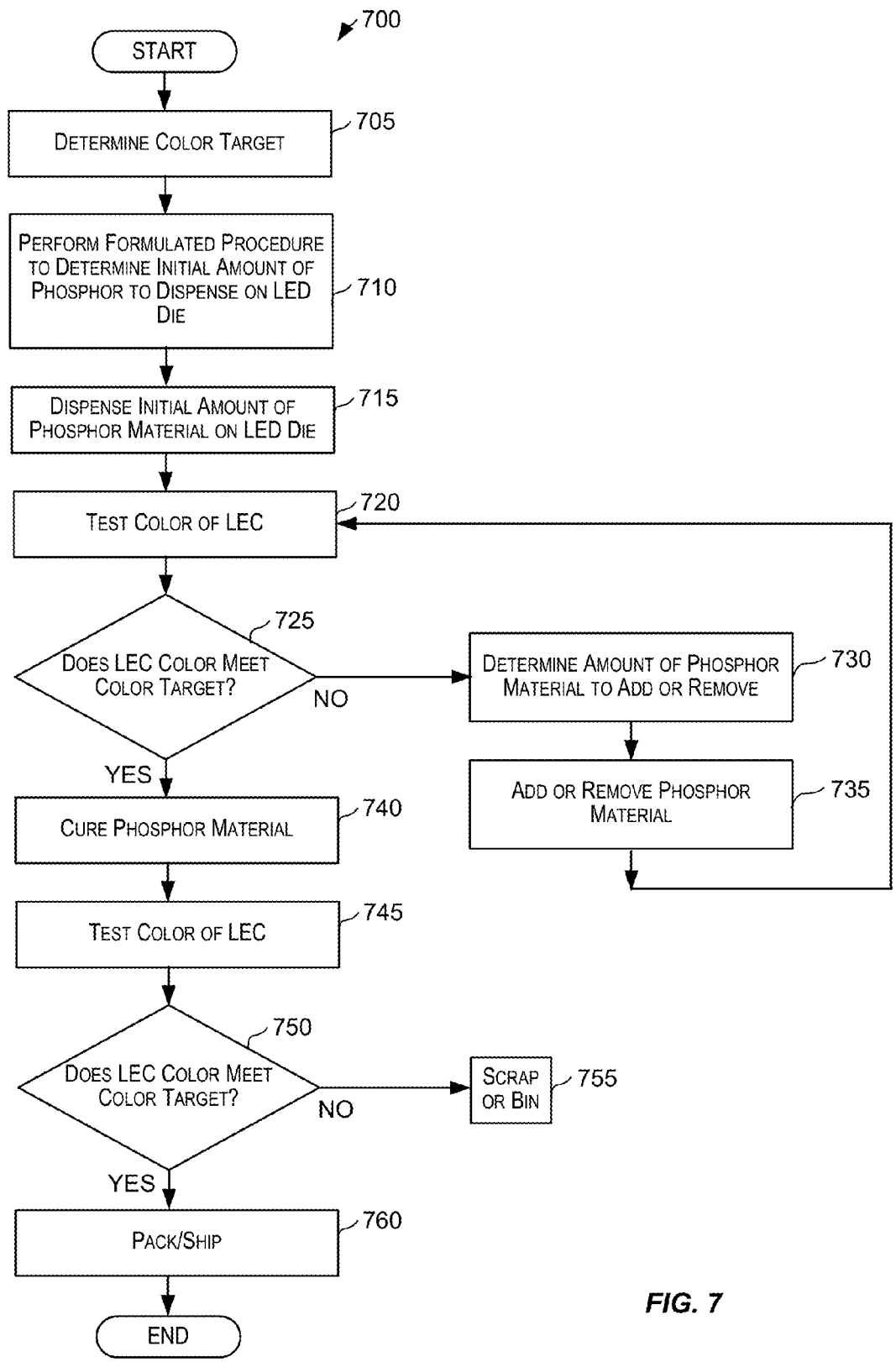
FIG. 7 is a process by which an LEC can be manufactured.

It should be appreciated that the specific steps illustrated in FIG. 7 provide particular methods for manufacturing an LEC, according to embodiments of the present invention. Other sequences of steps may also be performed according to alternative embodiments. In certain embodiments, the methods may perform the individual steps in a different order, at the same time, or any other sequence for a particular application. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives in light of the methods.

An example, simplified process 700 for manufacturing a LEC in accordance with embodiments described herein, is depicted in FIG. 7. In step 705 a color target for the LEC is determined. In step 710 a formulated procedure is performed to determine an initial amount of phosphor mixture to dispense on the LED die. An example procedure for determining the initial amount is described in FIGS. 5 and 6. In step 715 the initial amount of phosphor material is deposited on the one or more LED die. In step 720 the color of the LEC is tested. In step 725 it is determined whether the LEC meets the color target. If the LEC does not meet the color target then the process proceeds to step 730. As depicted in FIG. 2, in some embodiments more than one LEC may be disposed on panel. In further embodiments, each LEC on the panel may be individually tested to determine whether it meets the color target.

In step 730 a calculated amount of phosphor material is determined that is capable of bringing the failed LEC within the color target. The calculated amount of phosphor material that is required to be added or removed may be determined using a formulated procedure such as that described in FIGS. 5 and 6. In step 735 the calculated amount of phosphor material is either added or removed. In some embodiments, where more than one LEC is disposed on a panel, only those LEC's that do not meet the color target may have phosphor added or removed in step 735. The LEC's that were within the color target may remain unchanged.

The process then continues back to step 720 where the color of the LEC is tested again. This loop may repeat only once, or may repeat multiple times. In further embodiments the process may repeat until a particular yield goal is achieved. In embodiments that are manufactured in a panel having more than one LEC, all LEC's may be retested or only those LEC's that failed are retested. Once the LEC meets the color target in step 725 the process continues to step 740 where the phosphor material is cured. In embodiments having more than one LEC on a panel, the process may repeat until all LEC's meet the color target. Further, in embodiments where more than one LEC is disposed on a panel, all LEC's may be simultaneously cured. In step 745 the color of each LEC may be tested again, after curing. In embodiments having more than one LEC on a panel, the LEC's may be singulated before or after step 745. In step 750 it is determined if the LEC meets the color target. In other embodiments steps 745 and 750 may be skipped. If the LEC does not meet the color target the process proceeds to step 755 where the LEC is scrapped or binned. If the LEC does meet the color target then the process proceeds to step 760 where the LEC is packed and shipped.

Other variations are within the spirit of the present invention. Thus, while the invention is susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A method of manufacturing a light emitting component, the method comprising:
    determining a color target for the light emitting component;
    preparing a phosphor material based on the color target;
    determining an initial amount of the phosphor material required to meet the color target for the light emitting component;
    providing at least one light emitting die attached to a substrate;
    disposing the initial amount of the phosphor material over the at least one light emitting die;
    performing the steps of:
        (i) comparing light emitted from the light emitting component to the color target;
        (ii) if the light emitting component is above the color target, removing at least some of the initial amount of phosphor material from the light emitting component;
        (iii) if the light emitting component is below the color target, adding phosphor material to the light emitting component;
    repeating steps (i) through (iii) more than once; and
    curing the phosphor material disposed on the light emitting component.

2. The method set forth in claim 1 wherein the removing and the adding are performed by a manual operation.

3. The method set forth in claim 1 wherein the determining the initial amount of phosphor material is performed according to a formulated procedure.

4. The method set forth in claim 3 wherein the formulated procedure comprises a correlation between a change in position of a color of a light emitting die on a CIE diagram and a known quantity of phosphor material added to the light emitting die.

5. The method set forth in claim 1 wherein the color target comprises a MacAdam ellipse.

6. The method set forth in claim 1 wherein a retaining wall is formed around the at least one light emitting die, forming a cavity.

7. The method set forth in claim 6 wherein the phosphor material is disposed in the cavity.

8. The method set forth in claim 6 wherein the retaining wall is formed by a dispensed epoxy.

9. The method set forth in claim 6 wherein the retaining wall is preformed.

10. A method of manufacturing a plurality of light emitting components, the method comprising:
    determining a color target for the plurality of light emitting components;
    preparing a phosphor material based on the color target;
    determining an initial amount of the phosphor material required to meet the color target for the plurality of light emitting components;
    providing a plurality of light emitting dice attached to a substrate;
    disposing the initial amount of the phosphor material over the plurality of light emitting dice;
    comparing light emitted from each of the plurality of the light emitting components to the color target;
    performing the steps of:
        (i) identifying passing light emitting components that meet the color target;
        (ii) identifying high light emitting components that are above the color target and removing at least some of the initial amount of phosphor material from the high light emitting components;
        (iii) identifying low light emitting components that are below the color target and adding phosphor material to the low light emitting components;
        (iv) comparing light emitted from each of the high and each of the low light emitting components to the color target;
    curing the phosphor material disposed on the plurality of light emitting components; and
    singulating the plurality of light emitting components.

11. The method set forth in claim 10 wherein steps (i) through (iv) are repeated more than once.

12. The method set forth in claim 10 wherein steps (i) through (iv) are repeated until a predetermined number of passing light emitting components are identified.

13. The method set forth in claim 10 wherein the determining the initial amount of phosphor material is performed according to a formulated procedure.

14. The method set forth in claim 13 wherein the formulated procedure comprises a correlation between a change in position of a color of a light emitting die on a CIE diagram and a known quantity of phosphor material added to the light emitting die.

15. The method set forth in claim 10 wherein the color target comprises a MacAdam ellipse.

16. The method set forth in claim 10 wherein one or more retaining walls are formed around the plurality of light emitting dice, forming one or more cavities.

17. The method set forth in claim 16 wherein the phosphor material is disposed in the one or more cavities.

18. The method set forth in claim 16 wherein the one or more retaining walls are formed by a dispensed epoxy.

19. The method set forth in claim 16 wherein the one or more retaining walls are preformed.

20. The method set forth in claim 10 wherein each of the plurality of light emitting component comprises a plurality of light emitting dice.

\* \* \* \* \*